US008717802B2

(12) United States Patent
Lam et al.

(10) Patent No.: US 8,717,802 B2
(45) Date of Patent: May 6, 2014

(54) RECONFIGURABLE MULTI-LEVEL SENSING SCHEME FOR SEMICONDUCTOR MEMORIES

(75) Inventors: Chung H. Lam, Peekskill, NY (US); Scott C. Lewis, Essex Junction, VT (US); Jing Li, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 13/230,442

(22) Filed: Sep. 12, 2011

(65) Prior Publication Data

US 2012/0063195 A1 Mar. 15, 2012

Related U.S. Application Data

(60) Provisional application No. 61/382,197, filed on Sep. 13, 2010.

(51) Int. Cl.
*G11C 11/00* (2006.01)

(52) U.S. Cl.
USPC ......................................................... 365/148

(58) Field of Classification Search
USPC .......................................................... 365/148
See application file for complete search history.

(56) References Cited

U.S. PATENT DOCUMENTS

| | | |
|---|---|---|
| 5,936,906 A | 8/1999 | Tsen |
| 6,009,040 A | 12/1999 | Choi et al. |
| 6,307,783 B1 | 10/2001 | Parker |
| 6,956,779 B2 | 10/2005 | Tran |
| 6,961,266 B2 | 11/2005 | Chang |
| 6,975,539 B2 | 12/2005 | Tran |
| 7,142,464 B2 | 11/2006 | Dadashev |
| 7,359,246 B2 | 4/2008 | Sforzin et al. |
| 7,382,647 B1 | 6/2008 | Gopalakrishnan |
| 7,459,717 B2 | 12/2008 | Lung |
| 7,480,184 B2 | 1/2009 | Lam |
| 7,532,529 B2 | 5/2009 | Dadashev et al. |
| 7,567,473 B2* | 7/2009 | Breitwisch et al. ............ 365/203 |
| 7,580,297 B2 | 8/2009 | Nirschl et al. |
| 7,602,631 B2 | 10/2009 | Breitwisch et al. |
| 7,602,632 B2 | 10/2009 | Breitwisch et al. |
| 7,916,537 B2* | 3/2011 | Haines ..................... 365/185.03 |
| 8,000,127 B2* | 8/2011 | Hamilton et al. ............. 365/148 |
| 2003/0076432 A1* | 4/2003 | Luo et al. ....................... 348/308 |
| 2007/0232302 A1* | 10/2007 | Aminov et al. ............... 455/433 |
| 2009/0180371 A1* | 7/2009 | Lee ............................ 369/112.23 |
| 2011/0063277 A1* | 3/2011 | Menke et al. ................. 345/212 |

* cited by examiner

*Primary Examiner* — Hoai V Ho
*Assistant Examiner* — Pablo Huerta
(74) *Attorney, Agent, or Firm* — Daniel P. Morris, Esq.; Otterstedt, Ellenbogen & Kammer, LLP

(57) ABSTRACT

A method for sensing at least one parameter indicative of a logical state of a multi-level memory cell includes the steps of: measuring the parameter of the multi-level memory cell; comparing the measured parameter of the multi-level memory cell with a prescribed reference signal, the reference signal having a value which varies as a function of time; and storing a time value corresponding to a point in time at which the reference signal is substantially equal to the measured parameter of the multi-level memory cell, the stored time value being indicative of a sensed logical state of the multi-level memory cell.

20 Claims, 10 Drawing Sheets

RECONFIGURABLE MULTI-LEVEL SENSING SCHEME FOR SEMICONDUCTOR MEMORIES

CROSS-REFERENCE TO RELATED APPLICATIONS

This patent application claims the benefit of U.S. Provisional Patent Application Ser. No. 61/382,197 filed on Sep. 13, 2010, and entitled "Multi-level Sensing Scheme for Semiconductor Memories," the disclosure of which is expressly incorporated herein by reference in its entirety for all purposes.

FIELD OF THE INVENTION

The present invention relates generally to semiconductor memory devices, and more particularly relates to techniques for sensing data stored in semiconductor memory devices.

BACKGROUND OF THE INVENTION

Typical semiconductor memories are fabricated on semiconductor substrates including arrays of a large number of physical memory cells. In general, one bit of binary data is represented as a variation of a physical parameter associated with a memory cell. Commonly used physical parameters may include, for example, threshold voltage variation of a metal-oxide-semiconductor field effect transistor (MOSFET) in a memory cell of the memory device due to the amount of charge stored in a floating gate or a trap layer in non-volatile electrically erasable programmable read-only memory (EEPROM), resistance variation of a phase change memory (PCM) element in phase-change random access memory (PCRAM) or ovonic unified memory (OUM), and charge storage variation in volatile dynamic random access memory (DRAM).

Some issued U.S. patents which may be relevant to an understanding of the invention by the skilled artisan include, but are not limited to, U.S. Pat. No. 7,567,473 entitled "Multi-level Memory Cell Utilizing Measurement Time Delay as the Characteristic Parameter for Level Definition," U.S. Pat. No. 7,602,631 entitled "Multi-level Memory Cell Utilizing Measurement Time Delay as the Characteristic Parameter for Level Definition," U.S. Pat. No. 7,602,632 entitled "Multi-level Memory Cell Utilizing Measurement Time Delay as the Characteristic Parameter for Level Definition," U.S. Pat. No. 7,480,184 entitled "Maximum Likelihood Statistical Method of Operations for Multi-bit Semiconductor Memory," U.S. Pat. No. 5,936,906 entitled "Multilevel Sense Device for Flash Memory," U.S. Pat. No. 6,009,040 entitled "Apparatus and Methods for Controlling Sensing Time in a Memory Device," U.S. Pat. No. 6,307,783 entitled "Descending Staircase Read Technique for a Multilevel Cell NAND Flash Memory Device," U.S. Pat. No. 6,956,779 entitled "Multi-stage Autozero Sensing for a Multilevel Non-volatile Memory Integrated Circuit System," U.S. Pat. No. 6,961,266 entitled "Method of Programming-Reading Multi-Level Flash Memory Using Sensing Circuit," U.S. Pat. No. 6,975,539 entitled "Digital Multilevel Non-volatile Memory System," U.S. Pat. No. 7,142,464 entitled "Apparatus and Methods for Multi-level Sensing in a Memory Array," U.S. Pat. No. 7,532,529 entitled "Apparatus and Methods for Multi-level Sensing in a Memory Array," U.S. Pat. No. 7,359,246 entitled "Memory Device with a Ramp-Like Voltage Biasing Structure Base on a Current Generator," and U.S. Pat. No. 7,580,297 entitled "Readout of Multi-Level Storage Cells," the respective disclosures of which are incorporated herein by reference in their entireties for all purposes.

Multi-level cell (MLC) memory architectures having the capability of storing more than one bit of binary information in a given memory cell are well known. However, conventional sensing schemes for reading the respective states of MLCs in a memory array are often complex, slow, and inflexible, among other disadvantages, and thus undesirable.

SUMMARY OF THE INVENTION

The present invention, in illustrative embodiments thereof, relates to techniques for sensing the respective states of a MLC memory cell. Compared to conventional sensing schemes used, for example, in MLC flash memory architectures, sensing techniques according to aspects of the invention offer benefits of a simple structure, smaller chip area, faster speed (compared to MLC flash memory), increased fault tolerance, and flexibility in changing a precision level of the sensing operation for adapting, on the fly, to the number of bits stored in the memory cells, among other advantages.

In accordance with an embodiment of the invention, a method for sensing at least one parameter indicative of a logical state of a multi-level memory cell includes the steps of: measuring the parameter of the multi-level memory cell; comparing the measured parameter of the multi-level memory cell with a prescribed reference signal, the reference signal having a value which varies as a function of time; and storing a time value corresponding to a point in time at which the reference signal is substantially equal to the measured parameter of the multi-level memory cell, the stored time value being indicative of a sensed logical state of the multi-level memory cell.

In accordance with another embodiment of the invention, a sense circuit for sensing at least one parameter indicative of a state of a multi-level memory cell includes a reference signal generator operative to generate a reference signal having a value which dynamically varies as a function of time. The sense circuit further includes a monitor circuit operative to measure the parameter of the multi-level memory cell and to generate a sensed parameter signal indicative of a state of the multi-level memory cell. A comparator in the sense circuit is operative to receive the reference signal and the sensed parameter signal and to generate an output signal as a function of a difference between the reference signal and the sensed parameter signal. The sense circuit further includes memory operative as a function of the output signal generated by the comparator to store a time value corresponding to a point in time at which the reference signal is substantially equal to the sensed parameter signal. The stored time value is indicative of a sensed logical state of the multi-level memory cell.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
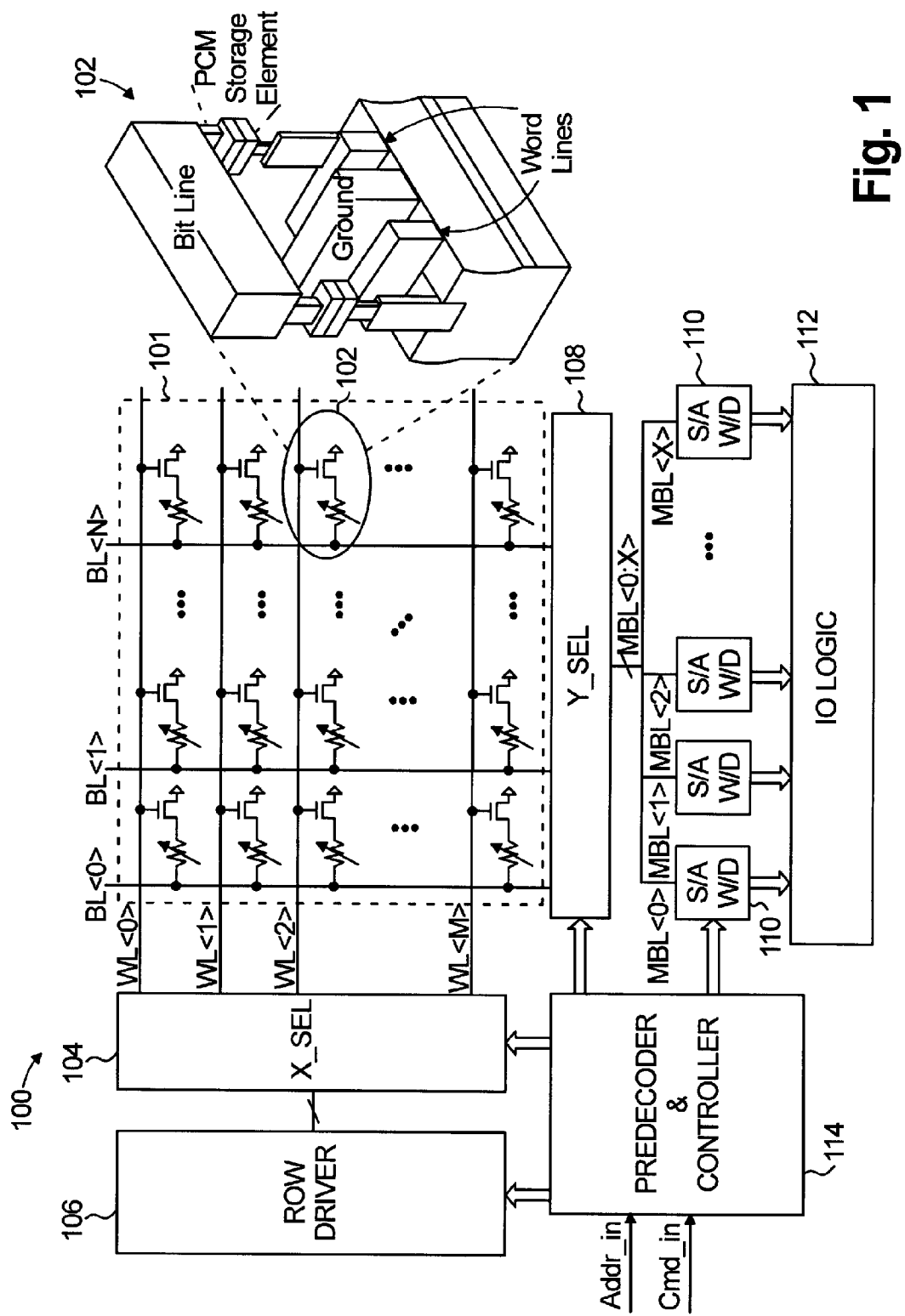
FIG. 1 is a schematic diagram depicting at least a portion of an exemplary memory circuit in which techniques of the invention may be implemented, according to an embodiment of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

The present invention, according to embodiments thereof, will be described herein in the context of reconfigurable sensing apparatus and methods for use in a multi-level cell semiconductor memory array, particularly a multi-level cell phase change memory (PCM), whether embedded or discrete. It is to be appreciated, however, that the invention is not limited to the specific apparatus and methods illustratively shown and described herein. Rather, aspects of the invention are directed broadly to enhanced techniques for accurately sensing one or more parameters indicative of a logical state of a multi-level storage cell in a semiconductor memory. The novel sensing techniques in accordance with aspects of the invention provide, among other advantages, a simple structure which occupies a smaller chip area and enables faster sensing speeds, compared to conventional approaches. Moreover, techniques of the invention beneficially provide the flexibility to change, on the fly, a precision (i.e., resolution) of sensing for multi-level memory cells during normal operation and/or for single-level memory cell characterization during test-mode operation.

It will become apparent to those skilled in the art given the teachings herein that numerous modifications can be made to the embodiments shown that are within the scope of the present invention. That is, no limitations with respect to the specific embodiments described herein are intended or should be inferred.

Aspects of the present invention advantageously provide a memory sensing circuit and methods for sensing, or components thereof, having improved performance and reliability. A memory circuit may comprise, for example, an embedded memory (e.g., a memory embedded within an IC) or a stand-alone (e.g., discrete) memory (e.g., a memory that is the primary component within an IC). Memories and their associated memory cells may be comprised of various types, including, but not limited to, volatile, nonvolatile, static, dynamic, read only, random access, flash, one-time programmable, multiple-time programmable, magnetoresistive phase-change memory (PCM), etc. Embedded memories are generally incorporated within a larger functional block, generally termed a logic circuit, for example, a microprocessor, a digital signal processor (DSP), a field programmable gate array (FPGA), an application-specific integrated circuit (ASIC), etc.

Memory circuits may be fabricated by semiconductor processing, such as, for example, bulk silicon or silicon-on-insulator (SOI) semiconductor fabrication. Such semiconductor fabrication methodologies are well-known in the art. Embedded memories may be fabricated by semiconductor processing technologies used to fabricate logic devices and logic circuits. Such semiconductor processing technologies may be referred to as logic fabrication technologies. Some, but not necessarily all, embedded memories may require processing steps in substitution for, or in addition to, those processing steps required by logic fabrication technologies. For example, forming DRAM cells may require extra processing steps known to those skilled in the art. Logic fabrication technologies may be known by their lithographic dimensions. Such logic fabrication technologies, for example, 45-nanometer (nm) or 32-nm technologies, may be used to fabricate memory sensing circuits according to embodiments of the invention, although the invention is not limited to any specific fabrication technology and/or dimensions.

For the purpose of describing and claiming the invention, the term MISFET may be used herein and is intended to be construed broadly to encompass any type of metal-insulator-semiconductor field effect transistor. The term MISFET is, for example, intended to encompass semiconductor field effect transistors that utilize an oxide material (e.g., silicon dioxide) as their gate dielectric (i.e., MOSFETs), as well as those that do not. In addition, despite a reference to the term "metal" in the acronym MISFET, the term MISFET is also intended to encompass semiconductor field effect transistors wherein the gate is formed from a non-metal such as, for instance, polysilicon.

Although implementations of the present invention described herein may be implemented using p-channel MISFETs (hereinafter called "PFETs" or "PMOS" transistors) and/or n-channel MISFETs (hereinafter called "NFETs" or NMOS transistors), as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

With reference now to FIG. 1, a schematic diagram depicts an exemplary memory circuit 100 in which techniques of the invention may be implemented, according to an embodiment of the present invention. Memory circuit 100 comprises a plurality of memory cells 102. Memory cells 102 are preferably organized as an array 101 including corresponding word lines (WL) and bit lines (BL) coupled to the memory cells for accessing the cells (e.g., reading and writing). Although the invention is not limited to any particular type or organization of memory cells, each of the memory cells 102 in memory array 101 is depicted, by way of illustration only, as including a variable resistor storage element connected in series with an access device. In this illustrative embodiment, memory circuit 100 includes M word lines and N bit lines, where M and N are integers. The invention is not limited to any particular values for M and N; moreover, M and N may be the same value. Each of the memory cells 102 in memory array 101 is preferably arranged such that it is coupled with a unique combination of a word line and a bit line.

Memory circuit 100 further includes a row decoder, X_SEL 104, corresponding row driver circuitry 106 coupled with the row decoder, a column decoder, Y_SEL 108, and one or more sense amplifiers (S/A) 110 coupled with the column decoder. In the illustrative memory circuit 100, X sense amplifiers are shown, where X is an integer. The number of sense amplifiers X employed in memory circuit 100 will typically be a function of a word length of the memory circuit, although it is to be appreciated that the invention is not limited to any specific number of sense amplifiers. An output of each of the sense amplifiers 110 is preferably supplied to input/output (IO) logic circuitry 112. IO logic circuitry 112 is essentially operative as an interface between the sense amplifiers 110 and circuitry residing externally to memory circuit 100.

A predecoder and controller circuit 114, or alternative controller, is coupled with row decoder 104, row driver circuitry 106, column decoder 108 and sense amplifiers 110. Predecoder and controller circuit 114 is preferably operative to receive, as inputs thereto, a first control signal, which may be an address signal (Addr_in), and a second control signal, which may be a data or command signal (Cmd_in), and to generate a plurality of output control signals for accessing (e.g., reading or writing) one or more selected memory cells 102 in the memory array 101 as a function of the input control signals.

Figure 2:
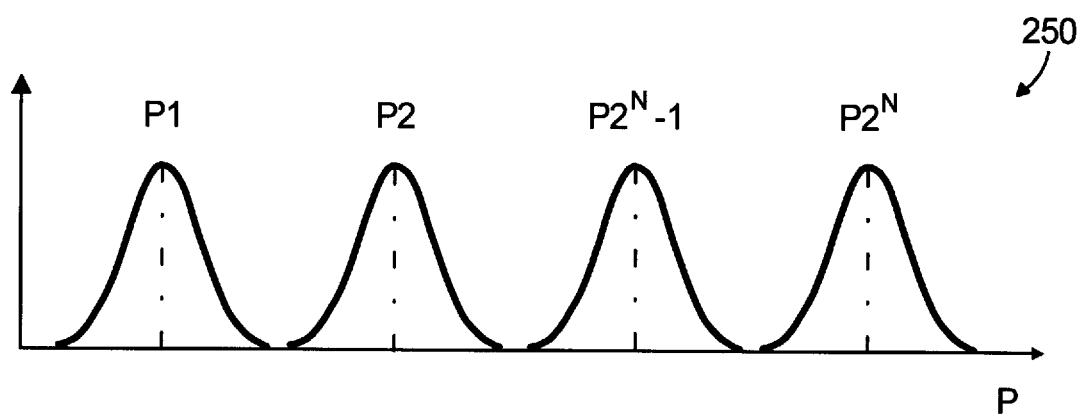
FIG. 2 is a schematic diagram depicting at least a portion of an exemplary memory cell suitable for use in the memory circuit shown in FIG. 1.
Figure 2:
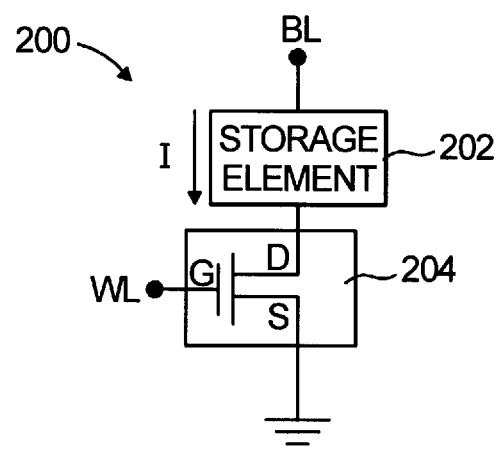

FIG. 2 is a schematic diagram depicting an exemplary memory cell 200 suitable for use in the memory array 101 shown in FIG. 1. Memory cell 200 includes a storage element 202 connected in series with an access device 204. A suitable storage element for use in memory cell 200 may include, but is not limited to, a phase change memory (PCM) element (e.g., based on a chalcogenide alloy material, such as doped $Ge_2Sb_2Te_5$), a magnetic tunnel junction (MTJ) element, a magnetoresistive (MR) element, and the like, which exhibits a measurable change in resistance, or an alternative parameter, as being indicative of a state of the memory cell. Similarly, a suitable access device 204 for use in memory cell 200 may include, but is not limited to, a MISFET (e.g., NMOS or PMOS transistor device) or an alternative switching element (e.g., diode, microelectromechanical system (MEMS) device, etc.). Preferably, the storage element 202 is integrated with the access device 204 at a third dimension (e.g., vertical, relative to a plane of a semiconductor substrate on which the memory circuit is formed), an example of which is shown in FIG. 1.

Memory cell 200 is preferably configured such that a first terminal of the storage element connected with a corresponding bit line (BL) and a second terminal of the storage element is connected with the access device 204, such as a drain (D) of an NMOS transistor device as shown. The access device 204 in a given memory cell 200 is operative to connect the corresponding storage element 202 to a prescribed voltage source, which may be ground or VSS, as a function of a control signal, which may be conveyed by a corresponding word line (WL), applied to a control input, e.g., a gate (G) of the access device. When the access device 204 is turned on (e.g., when WL is a logic high level), a current, I, will flow from the corresponding bit line, through the storage element 202 and access device 204, to ground. When the access device 204 is turned off (e.g., when WL is a logic low level), the second terminal of the storage element 202 essentially floats, thereby maintaining its stored state.

It is to be appreciated that, because a metal-oxide-semiconductor (MOS) device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

Increasing the number of bits to be stored in a single physical semiconductor memory cell is an effective method to lower manufacturing cost per bit. Multiple bits of data can also be stored in a single memory cell when variations of the physical parameter(s) thereof can be associated with multiple bit values. This multiple-bits storage memory cell is commonly known as a multi-level cell (MLC). A significant amount of effort in computer memory device and circuit designs has been devoted to maximizing the number of bits to be stored in a single physical memory cell. This is particularly true with storage-class memory such as popular non-volatile flash memories commonly used as mass storage devices.

A basic requirement for multiple-bit storage in a semiconductor memory cell is to have a spectrum of a physical and/or electrical parameter variation to accommodate multiple non-overlapping bands of values. The number of bands required for an n-bit cell is $2^n$s, where n is an integer. For instance, a 2-bit cell requires 4 bands of measurable parameter variation; a 3-bit cell requires 8 bands; and so forth. Thus, the available spectrum of the physical and/or electrical parameter in a semiconductor memory cell is a limiting factor for multiple-bit memory storage. Moreover, in addition to the limiting spectrum width, fluctuations in environmental variables such as, for example, temperature, power, and time, affect all operations and data integrity of a typical semiconductor storage device. Data integrity is a major problem for data storage systems due, at least in part, to fluctuations in the environmental variables.

PCM technology is one of the most promising successors for flash replacement with impressive data retention, endurance, performance and yield characteristics. In order to effectively compete in all the markets that flash memory now occupies, however, the cost of PCM should be reduced to a level which is on par with flash memory. State-of-the-art flash memory technology has already demonstrated the capability to store two bits of data per cell with a $4F^2$ memory cell foot print, and is moving towards the capability of storing four bits per cell. Memory cells for semiconductor devices may occupy an area of $4F^2$, where F is a minimum feature size of a technology, to provide reduced area and higher memory cell packing density. (See, e.g., U.S. Pat. No. 6,355,520, entitled "Method for Fabricating $4F^2$ Memory Cells with Improved Gate Conductor Structure," the disclosure of which is incorporated by reference herein.)

To improve storage capacity and to reduce cost-per-bit in PCM, one effective solution is MLC technology. In comparison to single-level cell (SLC) technology, MLC exploits the intrinsic capability of a memory cell to store more than one bit of data information by programming the memory cell into various analog states. The feasibility of MLC technology for PCM has been demonstrated for two and four bits per cell from a technology perspective. Unfortunately, increasing the number of bits to be stored in the memory cells places a significant burden on sensing circuitry (e.g., sense amplifiers 110) in a memory circuit.

As previously stated, techniques of the invention provide a means for accurately sensing one or more parameter levels indicative of respective logical states (i.e., bits) of a multi-level storage cell in a semiconductor memory. With continued reference to FIG. 2, an exemplary waveform 250 shows $2^N$ different parameter levels, $P1, P2, \ldots, P2^N-1, P2^N$, which may be stored in storage element 202, where N is an integer indicative of the number of bits of information able to be stored in the memory cell. For example, in one illustrative embodiment wherein memory cell 200 is capable of storing two bits of information (i.e., N=2), storage element 202 may take on one of four different parameter levels, each parameter level being indicative of a different state of the memory cell. The different parameter levels are depicted as distributions, rather than discrete values, which are more consistent with the manner in which the storage element 202 in an MLC stores information therein; namely, as non-overlapping analog bands of the sensed parameter (P).

By way of example only and without loss of generality, in the context of an illustrative PCM cell, the cell may take on various resistance levels depending on the respective states of the phase change material forming the storage element therein. It is to be understood, however, that the invention is not limited to measuring resistance levels of a memory cell. For example, in other embodiments, the measured parameter may be current, voltage, timing (e.g., resistor-capacitor (RC) timing), etc., associated with the memory cell.

Figure 3A:
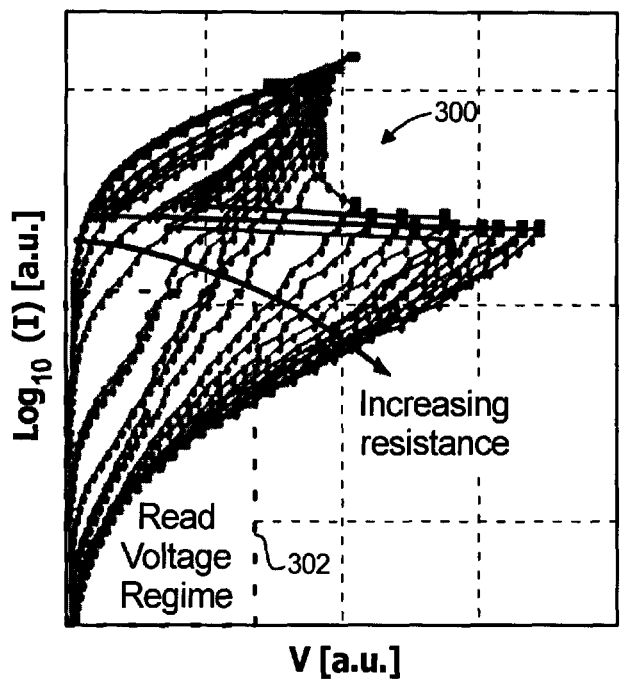
FIGS. 3A and 3B are graphical illustrations depicting a current-voltage characteristics waveform and a programming resistance-voltage waveform, respectively, corresponding to an exemplary phase-change memory cell suitable for use in the memory circuit shown in FIG. 1.

FIG. 3A is a graphical illustration depicting current-voltage (I-V) characteristic waveforms 300 corresponding to various resistance levels in an exemplary PCM cell. The static IV curve measurement for different states shows non-linear characteristics without considering switching. Increasing read voltage will improve sensing margin (large contrast between different resistance levels) at the cost of degraded reliability. Therefore, the sensing voltage should also be kept low enough to avoid destructive reads, also referred to as "read disturbs." For example, in a preferred embodiment, the sensing voltage level is about 0.2 to about 0.4 volt to avoid destructive reads. Considering variability in cell characteristics, both intrinsically (e.g., IC processing variations) and extrinsically (e.g., temperature, operating voltage, etc.), an adequate design margin is reserved and a safe operating read voltage regime 302 is preferably maintained, as shown in FIG. 3A.

Figure 3B:
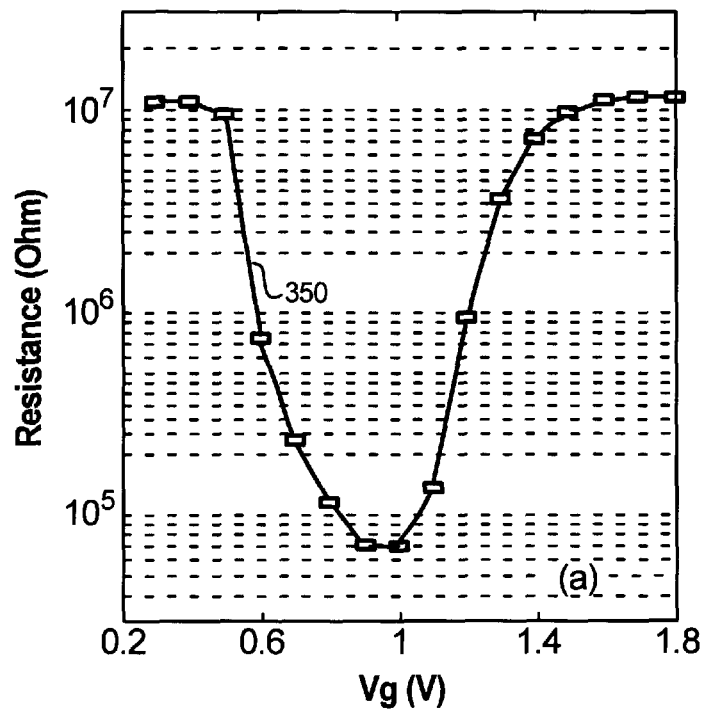

The programming of an MLC PCM cell into various states is preferably achieved by applying electrical pulses of various characteristics, including, for example, different amplitudes, pulse duration, rising and/or trailing edges. A programming resistance-voltage (R-V) curve 350, also referred to as a "U-curve," corresponding to an illustrative storage element in a PCM cell in depicted in FIG. 3B. With reference to FIG. 3B, continuously analog resistance levels can be achieved by precise control of applied programming pulses to thereby change the size of an amorphous structure (e.g., plug) in a current path of the storage element in the PCM cell, as known by those skilled in the art.

Figure 4:
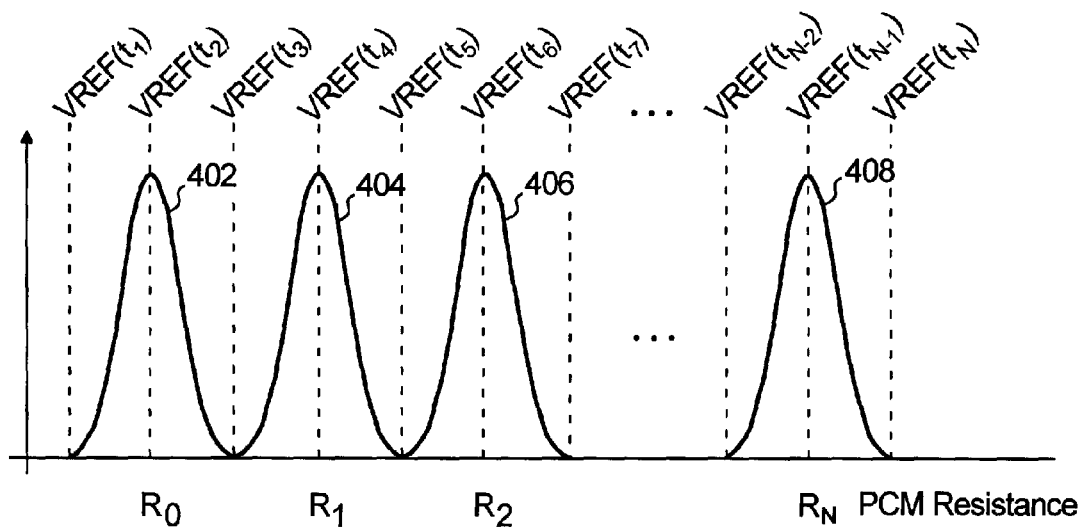
FIG. 4 conceptually illustrates at least a portion of an exemplary reconfigurable sensing scheme for sensing at least one parameter indicative of a logical state of a multi-level memory cell, according to an embodiment of the present invention.
Figure 4:
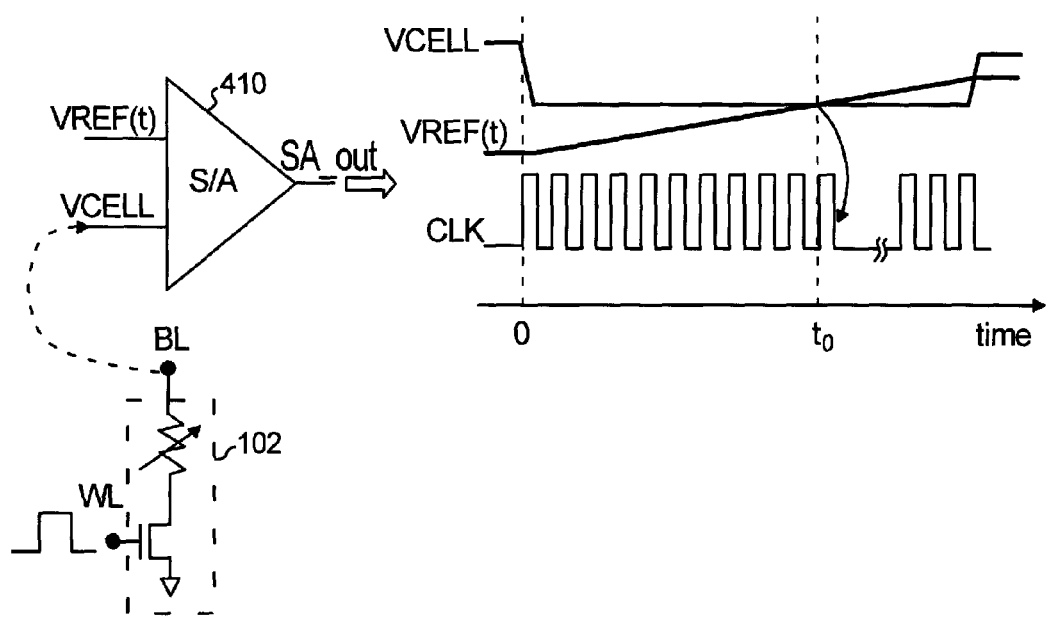

With reference now to FIG. 4, at least a portion of an exemplary reconfigurable sensing scheme for sensing at least one of a plurality of parameters indicative of a logical state of an MLC 102 is conceptually illustrated, according to an embodiment of the invention. The sense parameters are shown in FIG. 4 as a plurality of non-overlapping distributions 402, 404, 406, and 408, corresponding to various resistance values, $R_0, R_1, R_2, \ldots, R_N$, respectively, of a PCM storage element in the MLC 102 being sensed. It is to be appreciated that these parameter values may, alternatively, be representative of other sensed parameters, including, but not limited to, voltage, current, timing, etc., associated with the MLC 102. As will be described in further detail below, the inventive sensing methodology is reconfigurable in that it provides flexibility in easily adapting, on the fly, a precision level (i.e., resolution) of the sensing operation to read various parameter states in MLC cells (e.g., from SLC to 7 or more bits per cell).

Specifically, in contrast to sensing techniques employed in conventional MLC NAND flash memory, which utilizes either multiple fixed reference voltage sources with a fixed word line voltage level or multiple word line voltage levels with a fixed reference voltage source, the sensing technique according to embodiments of the invention uses a reference signal having a value which dynamically changes as a function of time. More particularly, the reference signal preferably varies continuously and monotonically with increasing time as sensing proceeds.

As shown in FIG. 4, a sense amplifier (S/A) 410 is operative to receive a first signal indicative of a measured parameter of a selected MLC in a memory circuit, which may be, for example, a measured voltage, VCELL, of the MLC, and a prescribed reference signal having a value which varies as a function of time, which may be, for example, a time-varying reference voltage, VREF(t), supplied by a reference signal generator (not explicitly shown) in the sense circuit. Signal VCELL, in this illustrative case, is preferably a voltage developed on a corresponding bit line (BL) of the MLC 102 once the MLC has been selected by an appropriate word line (WL) signal supplied to a gate of the access device in the MLC. Once fully developed on the bit line corresponding to the MLC 102, the signal VCELL will remain substantially constant during the sensing period.

Sense amplifier 410 is further operative to generate an output signal, SA_out, indicative of a difference between the first and reference signals. Thus, for instance, when the voltage level of the first signal VCELL is greater than a voltage level of the reference signal VREF(t) at some time, $t_i$, the output signal SA_out generated by sense amplifier 410 will be a first level (e.g., logic high level), and when VCELL is less than VREF(t), the output signal SA_out will be a second level (e.g., logic low level) which is measurably different than the first level (e.g., a logical complement of the first level). It is to be understood that the invention is not limited to any specific values for the first and second levels.

At the start of the sensing operation (e.g., time 0), the value of the reference signal VREF(t) is preferably below a lowest expected value of the measured first signal VCELL, as shown in FIG. 4. The reference signal VREF(t) is then increased at a prescribed rate. Reference signal VREF(t) is preferably generated as a monotonically increasing, linear voltage ramp (as shown), although the invention is not limited to the manner in which the reference signal varies. For example, the reference signal may be generated as a linearly decreasing ramp function, a logarithmically increasing or decreasing function, an exponential function, etc.

At some time (e.g., time $t_0$) after the start of the sensing operation, the reference signal VREF(t) will become equal to (and may cross) the measured cell signal VCELL (e.g., either by going above or below VCELL), at which point the output signal SA_out generated by sense amplifier 410 will exhibit a measurable change in value (e.g., switches logic states). A time value corresponding to the point at which the reference signal is substantially equal to the measured parameter of the MLC is preferably recorded (e.g., stored), the recorded time value being indicative of a sensed logical state of the MLC.

It will become apparent to those skilled in the art given the teachings herein that the reference signal VREF(t) may, alternatively, at the start of the sensing operation (e.g., time 0), have a value that is above a highest expected value of the measured first signal VCELL. In this scenario, the reference signal VREF(t) would be generated as a monotonically decreasing function (e.g., a linearly decreasing voltage ramp). However, the methodology for recording the time value at which point the output signal SA_out generated by sense amplifier 410 changes state will remain essentially the same.

In accordance with an embodiment of the invention, the time value at which point the output signal SA_out generated by the sense amplifier 410 changes state may be recorded by storing a start time indicative of the start of the sensing operation and storing a stop time indicative of a change in state of the sense amplifier 410 (e.g., the point at which the reference signal is substantially equal to the measured parameter of the MLC). The recorded time value corresponding to the sensing operation is then computed as a function of a difference between the start and stop times (i.e., an elapsed time).

A clock signal, CLK, which generates a continuous series of clock pulses at least during the sensing operation (see FIG. 4), in conjunction with one or more counters, are preferably employed for determining the start and stop times, according to an aspect of the invention. For instance, storing the start time may be performed by recording a first value of a clock cycle counter at the start of the sensing operation and storing the stop time may be performed by recording a second value of the counter when the reference signal is substantially equal to the measured parameter of the MLC. The recorded time value corresponding to the sensing operation is then computed as a function of a difference between the first and second values of the counter. Thus, referring to the example shown in FIG. 4, assuming the first value of the counter at time 0 is zero and the second value of the counter at time $t_0$, indicative of the point at which sense amplifier 410 changes state, is ten, the recorded time value corresponding to the sensing operation would be ten. Since the rate of change of the reference signal VREF will be known, the recorded time value can be easily correlated with a measured resistance value, and thus the logical state, of the MLC.

With regard to sensing precision, a frequency of the clock signal CLK and a rate of change of the reference signal VREF(t) are selectively controlled so as to provide a desired sensing resolution. Moreover, the sensing resolution is ideally not fixed, but may be changed on the fly, as previously stated. Preferably, the clock frequency and rate of change of the reference signal are chosen such that there is at least one clock cycle for every sensed parameter. In other words, the reference signal does not pass through more than one distribution of sensed parameters during any given clock cycle. In this manner, there will always be at least one count value for each parameter to be evaluated during the sense operation so that the sense circuit can discriminate between each of the plurality of sense parameters which the MLC may exhibit. It is to be understood, however, that the invention is not limited to any specific clock frequency or rate of change of the reference signal.

Sensing precision may be advantageously controlled as a rate of change of the reference signal VREF(t) with respect to clock frequency. Thus, the more clock cycles there are within the evaluation period and/or the higher the rate of change of the reference signal VREF(t), the higher the sensing resolution. As a trade-off, increasing sensing precision may result in an increase in the overall time necessary for sensing the state of the MLC.

Figure 5:
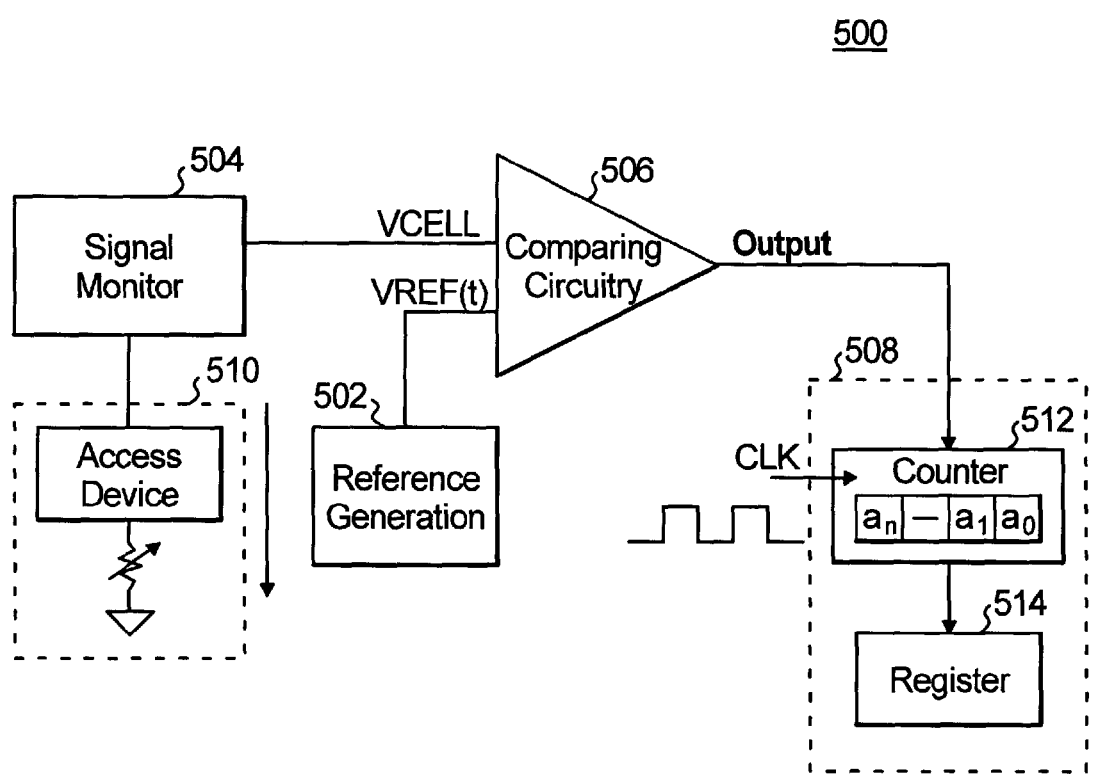
FIG. 5 is a block diagram depicting at least a portion of an exemplary sense circuit operative to perform sensing techniques of the invention conceptually described in FIG. 4, according to an embodiment of the invention.

FIG. 5 is a block diagram depicting at least a portion of an exemplary sense circuit 500 operative to perform sensing techniques of the invention conceptually described in FIG. 4, according to an embodiment of the invention. The illustrative sense circuit 500 preferably comprises four basic building blocks: a reference generator 502; an MLC signal monitor 504; comparison circuitry 506; and time evaluation and storage circuitry 508. MLC signal monitor 504 is connected with an MLC 510 to be sensed, via selection and control circuitry (e.g., column decoder 108 and predecoder and controller circuit 114 shown in FIG. 1) included in the memory circuit. In a generic sense, signal monitor 504 is operative to monitor at least one parameter of an MLC to be sensed, the parameter being indicative of a state stored in the MLC. The parameter being monitored may include various characteristics associated with the cell, such as, but not limited to, cell voltage, current, resistance, RC timing, etc., of the cell, as previously stated. The signal monitor 504 may, therefore, be implemented in a number of different ways corresponding to the particular parameter being sensed.

For example, in an illustrative embodiment in which the MLC comprises a PCM storage element which exhibits various resistance levels indicative of the respective states of the cell, signal monitor 504 is preferably operative to apply a prescribed current to the MLC 510 being sensed and to measure an output voltage of the MLC to thereby determine a resistance of the cell. In an alternative embodiment, the MLC signal monitor 504 may be operative to apply a prescribed voltage to the MLC 510 being sensed and to measure an output current of the MLC to thereby determine the resistance of the cell. Regardless of the methodology used, however, signal monitor 504 is operative to measure a parameter of the MLC 510 being sensed, the parameter being representative of a state of the MLC (e.g., PCM resistance), and to generate a signal, VCELL, that is indicative of the measured parameter, which is supplied to a first input of comparison circuitry 506.

Figure 6:
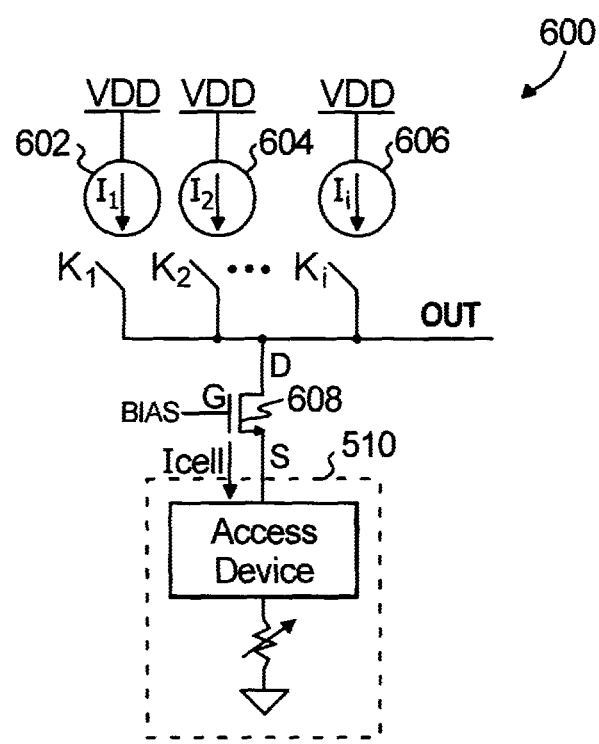
FIG. 6 is a schematic diagram depicting at least a portion of an exemplary signal monitor suitable for use in the illustrative sense circuit shown in FIG. 5, according to an embodiment of the invention.

FIG. 6 is a schematic diagram depicting at least a portion of an exemplary signal monitor 600 suitable for use in the illustrative sense circuit 500 shown in FIG. 5, according to an embodiment of the invention. In this embodiment, signal monitor 600 comprises a programmable current generator including a plurality of current sources, 602, 604, ..., 606, each current source generating a prescribed current, $I_1$, $I_2$, ..., $I_i$, respectively, where i is an integer. It is to be appreciated that the invention is not limited to any particular values for the respective currents generated by current sources 602 through 606; each current $I_1, I_2, \ldots, I_i$ may be different relative to one another or, alternatively, two or more of the currents may be the same. Each current source 602, 604, ..., 606 is connected in series with a corresponding selection switch, $K_1$, $K_2$, respectively. The current sources 602, 604, ..., 606 and their corresponding selection switches $K_1, K_2, \ldots, K_i$, respectively, are connected together in parallel between a voltage source, which may be VDD, and a common node, OUT, which forms an output of the signal monitor 600. Node OUT functions essentially as a summing junction.

Switches $K_1$ through $K_i$ can be implemented in a number of ways, as will become apparent to those skilled in the art. For instance, switches $K_1$ through $K_i$ may represent a fuse register, ROM, RAM, MOSFET, etc., and may be used to provide a means of adjusting the current flowing into node OUT a single time (e.g., during wafer testing), or, alternatively, multiple times (e.g., during initialization of the sense circuit).

Signal monitor 600 further includes an NMOS transistor device 608 which is connected with the programmable current generator in a source follower arrangement. Specifically, a drain of NMOS device 608 is connected with node OUT, a source of the NMOS device is connected with the MLC 510 to be sensed, and a gate of NMOS device 608 is adapted for receiving a control signal, BIAS, for biasing the NMOS device at a prescribed quiescent operating point. A current, $I_{cell}$, flowing through the NMOS device 608 (i.e., flowing out of node OUT) will be determined by the resistance of the cell state. The current flowing into node OUT is a function of which selection switches $K_1$ through $K_i$ are activated (i.e., $I_{cell} = \Sigma_{n=1}^{i} K_n \cdot I_n$, where $K_n$ represents a logical state—"0" for disabled and "1" for enabled—of a corresponding current $I_n$). Thus, by way of illustration, if all switches $K_1$ through $K_i$ are activated, the current flowing into node OUT will be a summation of all current sources 602 through 606 (i.e., $I_{cell} = I_1 + I_2 + \ldots I_i$).

With reference again to FIG. 5, the reference generator 502 is connected with a second input of the comparison circuitry 506 and is operative to generate a prescribed reference signal, VREF(t), having a value which varies as a function of time, as previously described. In this embodiment, the reference signal is a time-varying voltage, although the invention is not limited to a voltage-based reference signal. As previously described, the comparison circuit 506 is operative to generate an output signal (Output) indicative of a difference between the sensed MLC parameter signal VCELL supplied to the first input of the comparison circuitry and the reference signal VREF(t) supplied to the second input.

At the start of the sensing operation, when VREF(t) is below a minimum expected level of VCELL (or alternatively, above a maximum expected level of VCELL), the comparison circuitry 506 will generate an output having a first level. As sensing proceeds, the reference signal VREF(t) is increased at a prescribed rate (or alternatively, decreased at the prescribed rate) as a function of a clock signal, CLK, supplied to the sense circuit 500. This clock signal is also supplied to a counter 512 included in the time evaluation and storage circuitry 508, such that VREF(t) is preferably changed every cycle of the clock. In other embodiments, there may be less than one clock cycle (i.e., double clock rate at both rising and falling edges) for each change in level of the reference signal VREF(t). A range of the counter 512 (i.e., number of bits) is preferably selected to be large enough such that it will not overflow during a given sensing period.

Regardless of the timing arrangement, there will be some time, $t_i$, at which the reference signal VREF(t) is equal to, and may exceed (i.e., cross), the sensed MLC parameter signal VCELL. At this time $t_i$, the comparison circuitry 506 will generate an output having a second level (i.e., the comparison circuitry 506 switches state). Upon detection of a change in state of the comparison circuitry 506, a count value of the counter 512 is preferably transferred to and stored in a register 514, or an alternative storage means, associated with the comparison circuitry. Since the clock frequency and rate of change of the reference signal VREF(t) will be known, this stored count value can be easily correlated with the sensed parameter to determine the logical state of the MLC being sensed.

Figure 7:
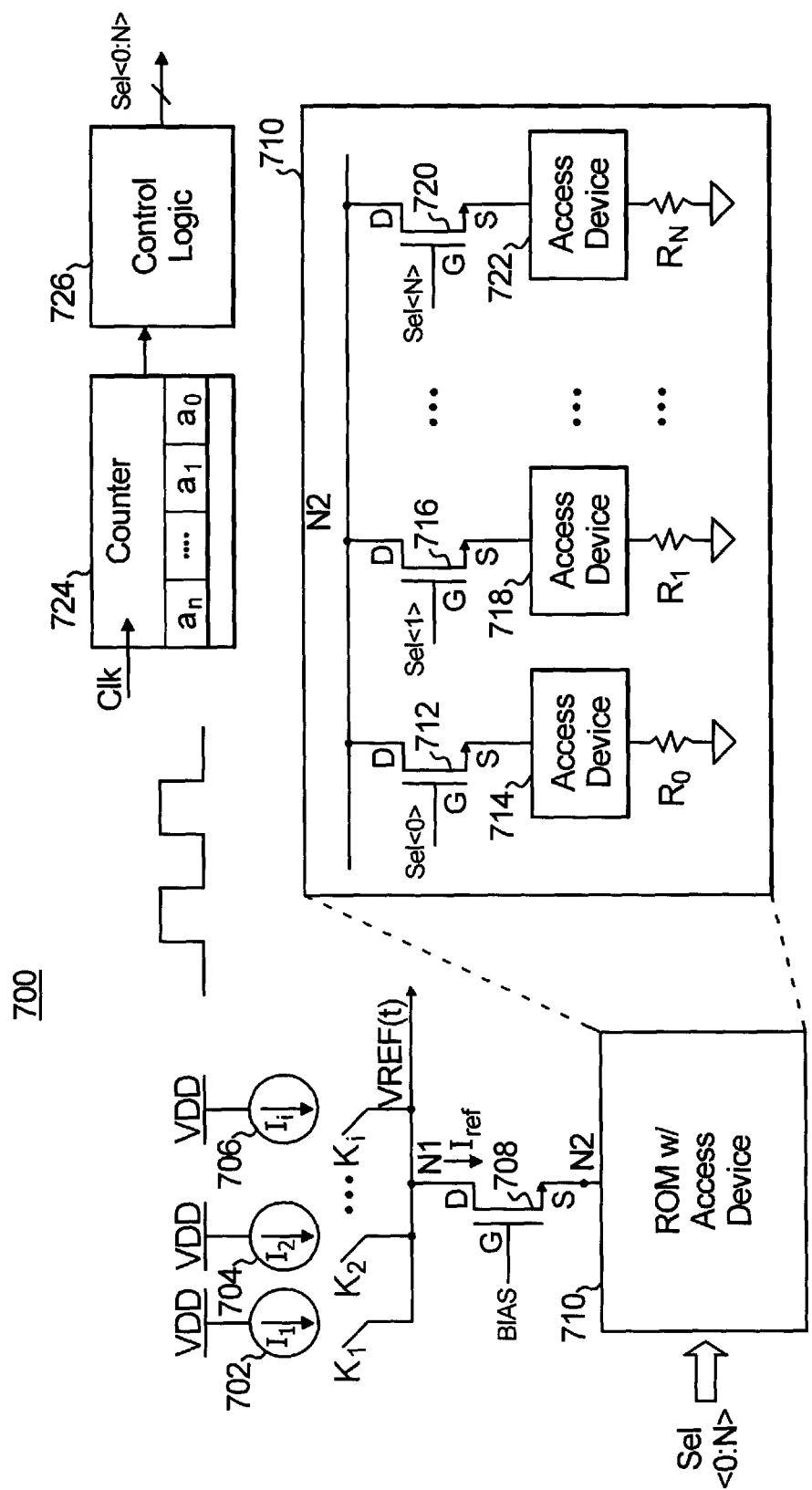
FIG. 7 is a schematic diagram depicting at least a portion of an exemplary reference generator suitable for use in the illustrative sense circuit shown in FIG. 5, according to an embodiment of the invention.

FIG. 7 is a schematic diagram depicting at least a portion of an exemplary reference generator 700 suitable for use in the illustrative sense circuit 500 shown in FIG. 5, according to an embodiment of the invention. In a manner consistent with signal monitor 600 shown in FIG. 6, the reference generator 700 preferably comprises a programmable current generator including a plurality of current sources, 702, 704, ..., 706, each current source having a prescribed current value, $I_1, I_2, \ldots, I_i$, respectively, associated therewith, where i is an integer. It is to be understood that the invention is not limited to any particular current values for the respective current sources 702 through 706; each current value $I_1, I_2, \ldots, I_i$ may be different relative to one another or, alternatively, two or more of the current values may be the same. Each current source 702, 704, ..., 706 is connected in series with a corresponding selection switch, $K_1, K_2, \ldots, K_i$, respectively. The current sources 702, 704, ..., 706 and their corresponding selection switches $K_1, K_2, \ldots$, respectively, are connected together in parallel between a voltage source, which may be VDD, and a common node, N1, which forms an output of the reference generator 700. Node N1 functions essentially as a summing junction in this embodiment.

Reference generator 700 further includes an NMOS transistor device 708 which is connected with the programmable current generator as a source follower. Specifically, a drain of NMOS device 708 is connected with the current sources 702 through 706 at node N1, a source of NMOS device 708 is connected with a programmable load circuit 710 at node N2, and a gate of NMOS device 708 is adapted for receiving a control signal, BIAS, for biasing the NMOS device at a prescribed quiescent operating point. A current, Iref, flowing through the NMOS device 708 (i.e., flowing out of node N1) will be determined primarily by the resistance of the reference cell state. The current flowing into node N1 is will be determined as a function of which selection switches $K_1$ through $K_i$ are activated at any given time. More particularly, Iref will be a summation of all enabled current sources 702 through 706 (i.e., $Iref = \Sigma_{n=1}^{i} K_n \cdot I_n$, where $K_n$ represents a logical state—"0" for disabled and "1" for enabled—of a corresponding current $I_n$).

The programmable load circuit 710 preferably comprises a plurality of hard programmed ROM cells effectively forming a resistor selection network which provides various resistance levels controlled as a function of one or more control signals, Sel<0:N>, supplied to the programmable load circuit. By controlling the impedance of the programmable load circuit 710 exhibited at node N2, a voltage level of an output signal, VREF(t), generated by the reference generator 700 at node N1 can be selectively controlled for any given time $t_i$.

In this illustrative embodiment, programmable load circuit 710 preferably includes a plurality of selectable resistance legs connected together in parallel between node N2 and a second voltage source, which may be VSS or ground. Each selectable resistance leg preferably comprises a selection switch, which may be implemented as an NMOS transistor device, an access device and a resistance element coupled together in series. Specifically, programmable load circuit 710 comprises a first selection switch 712 connected in series with a first access device 714 and a corresponding resistance $R_0$, a second selection switch 716 connected in series with a second access device 718 and a corresponding resistance $R_1$, and an N-th selection switch 720 connected in series with an N-th access device 722 and a corresponding resistance $R_N$, where N is an integer greater than zero. A drain of each of the selection switches 712, 716 and 720 is connected together at node N2, a source of each of the selection switches 712, 716 and 720 is connected with a corresponding access device 714, 718 and 722, respectively, and a gate of each of the selection switches 712, 716 and 720 is adapted to receive a corresponding control signal Sel<0>, Sel<1> and Sel<N>, respectively. Although the respective selection switches 712, 714, and 720 are depicted as MOS transistor devices, the invention is not limited to such an arrangement.

Ideally, for more accurate tracking of the reference signal with the measured MLC parameter, the programmable current generator in reference generator 700 is substantially identical to the programmable current generator in signal monitor 600 described above in conjunction with FIG. 6. Moreover, each of the access devices 714, 718, 722 and corresponding series resistors $R_0$, $R_1$, $R_N$ in programmable load circuit 710 are preferably substantially matched to the access device and corresponding resistance of the storage element, respectively, in an MLC to be sensed.

Signals Sel<0:N> used to control the resistance of the programmable load circuit 710, and thereby control the reference signal VREF(t), may be generated by circuitry included in the reference generator 700, although these control signals can alternatively be generated externally and supplied to the reference generator. In this embodiment, reference generator 700 preferably includes a counter 724 and control logic 726 connected with the counter. Counter 724 is adapted to receive a clock signal, CLK, and is operative to generate an output count value in a conventional manner. The width of the output count value will be dependent upon the number of bits in the counter, as become apparent to those skilled in the art.

Control logic 726 is preferably operative to receive the output count value generated by the counter 724 and to generate the control signals Sel<0:N> as a function thereof. Specifically, at each transition (e.g., rising and/or falling edge) of the clock signal, the control logic 726 preferably loads the output of counter 724 and translates this output into a series of selection signals (SEL<0:N>) which, in return, changes the reference signal VREF(t). Although a relatively fast clock is preferably employed during the sensing operation for better performance, the delay between the trigger point of the comparator (i.e., the cross point at which VREF(t) becomes equal to VCELL) and the final data output can be more than one clock cycle. However, the offset can be characterized and will not affect sensing accuracy. In an illustrative embodiment, control logic 726 may comprise a decoder operative to receive n input signals indicative of a binary count value of counter 724, and to generate $2^n$ output signals, only one output signal being asserted at any given time, and each output corresponding to one valuation of the input signals.

The number of resistance levels and their values are preferably chosen based, at least in part, on a resistance range of interest (and thus a desired range of reference signal VREF (t)) and on a desired sensing precision (i.e., resolution). Since PCM cell resistance typically follows a logarithmic distribution with a nominal range on the order of about ten kilohms to about one megohm, a series of resistors are chosen and each of the resistance values is preferably uniformly distributed in logarithmic scale. By way of illustration only and without limitation, an 8-bit counter is employed which is suitable to provide up to 256 different resistance values obtained from the programmable load circuit 710. The counter 724 is preferably activated at the start of the sensing operation.

Figure 8:
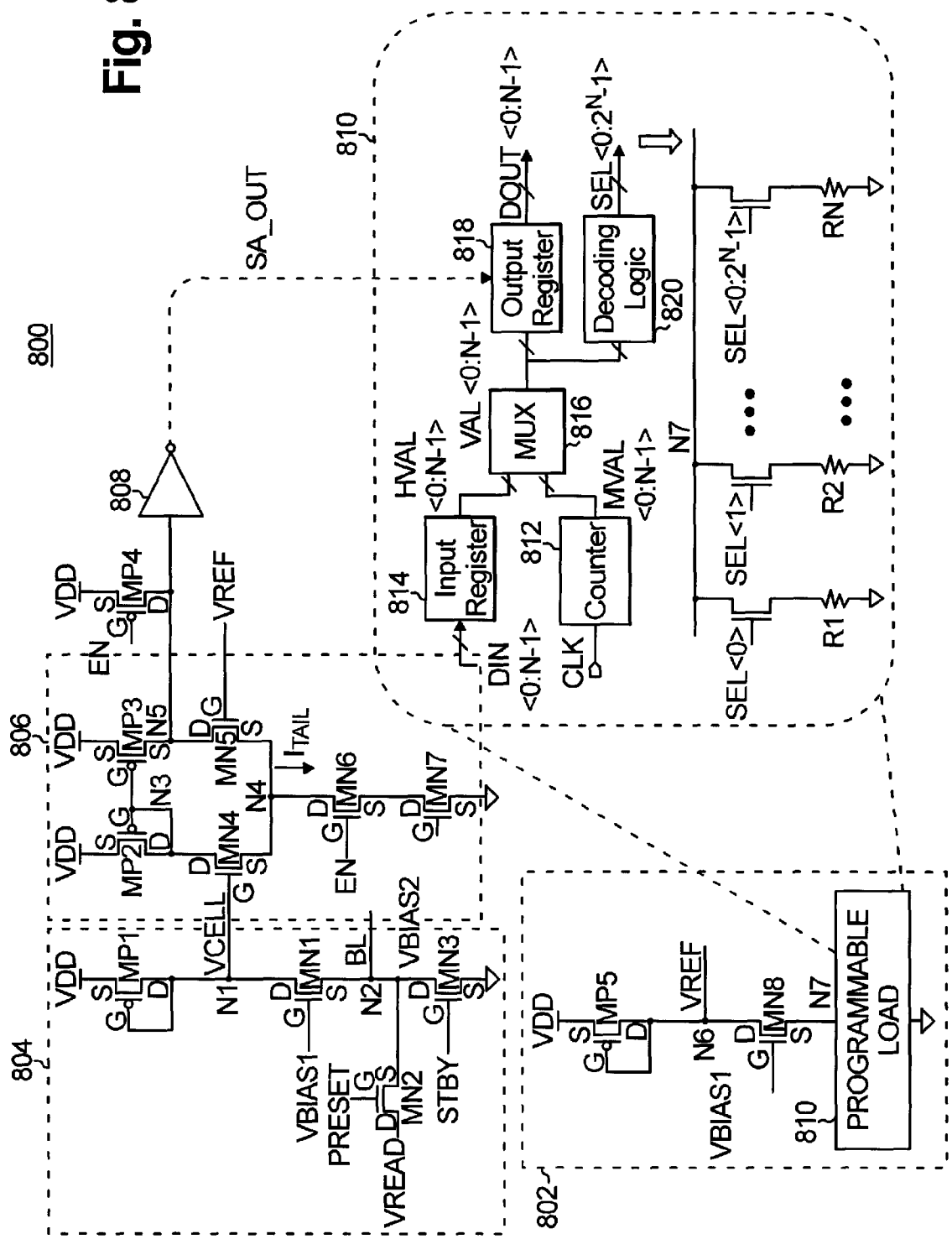
FIG. 8 is a schematic diagram depicting at least a portion of an exemplary sense circuit, according to an embodiment of the invention.

With reference now to FIG. 8, a schematic diagram is shown depicting at least a portion of an exemplary sense circuit 800, according to an embodiment of the invention. Sense circuit 800 is merely one illustrative implementation of the exemplary sense circuit 500 shown conceptually in FIG. 5. In a manner consistent with sense circuit 500 (FIG. 5), sense circuit 800 includes, as basic building blocks, a reference generator 802, an MLC signal monitor 804 and a comparator 806.

MLC signal monitor 804 preferably comprises a first PMOS transistor, MP1, connected in a diode configuration, a first NMOS transistor, MN1, connected as a source follower, and second and third NMOS transistors, MN2 and MN3, respectively, operative to provide selective access to an MLC to be sensed. More particularly, a source of MP1 is adapted for connection to a first voltage supply, which may be VDD, and a drain and gate of MP1 are connected together at node N1, which forms an output of the signal monitor 804. A drain of MN1 is connected to node N1, a gate of MN1 is adapted to receive a first bias signal, VBIAS1, and a source of MN1 is adapted for connection with a bit line (BL) corresponding to the sensed MLC at node N2. The voltage level of bias signal VBIAS1 will essentially clamp the bit line at a voltage which is about an NMOS transistor threshold voltage ($V_{tn}$) below VBIAS1. A source of MN2 is connected to node N2, a gate of MN2 is adapted to receive a first control signal, PRESET, for precharging the selected bit line to a prescribe voltage level prior to performing a read operation, and a drain of MN2 is adapted to receive a second control signal, VREAD, for initiating the sensing operation. A drain of MN3 is connected to node N2, a gate of MN3 is adapted to receive a third control signal, STBY, operative to disable the signal monitor 804 during a standby mode of operation of the memory circuit, and a source of MN3 is adapted for connection to a second voltage supply, which may be VSS or ground.

Note, that when MLCs are not selected or in standby mode, the bit lines (BLs) in the memory circuit are preferably precharged to ground so that power consumption in the memory circuit is ideally zero. During a read operation, the MLC signal monitor 804 in sense circuit 800 monitors the voltage, VCELL, developing on the sense node N1, which is indicative of the sensed MLC voltage on the corresponding bit line.

Comparator 806 preferably comprises a conventional differential voltage amplifier, although the invention is not limited to the particular implementation shown. Specifically, comparator 806 comprises first and second NMOS transistors, MN4 and MN5, respectively, coupled together with a bias circuit including third and fourth NMOS transistors, MN6 and MN7, respectively, to form a differential input stage. More particularly, sources of MN4 and MN5 are connected together at common tail node N4, a gate of MN4 is adapted to receive a first input signal, which is VCELL in this embodiment, and a gate of MN5 is adapted to receive a second input signal, which is VREF in this embodiment. MN7 functions as a bias stage for supplying a tail current, $I_{TAIL}$, to the differential amplifier. A source of MN7 is adapted for connection with VSS, a gate of MN7 is adapted to receive a second bias signal, VBIAS2, and a drain of MN7 is connected with tail node N4 via MN6, which functions as a switch. A source of MN6 is connected with the drain of MN7, a gate of MN6 is adapted to receive an enable signal, EN, for selectively disabling the comparator 806 (e.g., in a standby mode or power-down mode), and a drain of MN6 is connected with node N4.

The differential input stage is coupled with a load stage including a pair of PMOS transistors, MP2 and MP3, connected in a current mirror configuration. Specifically, sources of MP2 and MP3 are adapted for connection with VDD, a gate and drain of MP2 are connected together with a drain of MN4 at node N3, a gate of MP3 is connected with the gate of MP2 at node N3, and a drain of MP3 is connected with a drain at node N5 and forms an output of the comparator 806.

Optionally, a buffer circuit 808 may be connected with the output of the comparator 806 at node N5. In this embodiment, the buffer circuit 808 comprises an inverter, although it is to be appreciated that the comparator 806 may, alternatively, comprise a non-inverting buffer. Regardless of whether buffer circuit 808 is inverting or non-inverting, an output signal, SA_OUT, generated by the buffer circuit will be a buffered version of the comparator output at node N5.

Additionally, a third PMOS transistor, MP4, may be coupled to the output of the comparator at node N5. Specifically, a source of MP4 is adapted for connection with VDD, a source of MP4 is connected with node N5, and a gate of MP4 is adapted to receive the enable signal EN. MP4 functions, at least in part, to prevent the output of the comparator 806 at node N5 from becoming undefined when the bias stage is disabled with an active low enable signal. Without MP4, when MN6 is turned off (e.g., when signal EN is low), the tail current $I_{TAIL}$ will drop to substantially zero (ignoring leakage current), thereby effectively turning off MP3 and MN5. In this instance, node N5 will be floating at an undefined level. When signal EN is low, MP4 will turn on, thereby pulling up node N5 to VDD and setting SA_OUT to zero.

Reference generator 802 preferably comprises a PMOS transistor, MP5, connected in a diode configuration. Specifically, a source of MP5 is adapted for connection with VDD, and a gate and drain of MP5 are connected together to node N6, which forms an output of the reference generator for generating a reference voltage, VREF. Ideally, MP5 is substantially matched to MP1 in the MLC signal monitor 804 so that the current supplied to the MLC to be sensed is substantially the same as the current supplied to the programmable load circuit 810. Reference generator 802 further includes an NMOS transistor, MN8, and a programmable load circuit 810 coupled in series with MP8. MP8 functions as a source follower, having a drain connected with the drain of MP5 at node N6, a gate adapted for receiving the first bias signal VBIAS1, and a source connected with the programmable load circuit 810 at node N7.

As previously explained in conjunction with load circuit 710 depicted in FIG. 7, programmable load circuit 810 is operative to control a level of the reference signal VREF such that a value of VREF varies in a prescribed manner as a function of time. For example, programmable load circuit 810 preferably includes a plurality of hard programmed ROM cells, each cell including an access transistor, which may be gated by a corresponding one of control signals SEL<0:$2^N$-1>, and a resistance element connected together in series. The ROM cells are preferably connected together in parallel between common node N7 and VSS, thereby effectively forming a resistor selection network which provides various resistance levels controlled as a function of control signals SEL<0:$2^N$-1>, which may be generated by the programmable load circuit itself or by alternative means. By controlling an impedance of the programmable load circuit 810, the level of the reference signal VREF can be selectively controlled for any given time $t_i$.

Programmable load circuit 810 may include circuitry for generating the control signals SEL<0:$2^N$-1> for controlling which of resistance elements R1 through RN is connected in the resistor selection network at any given time. Specifically, load circuit 810 preferably includes a counter 812 operative to receive a clock signal, CLK, and to generate an N-bit output count value, MVAL<0:N-1>, as a function of the clock signal, where N is an integer. The clock input to the counter 812 may be directly fed from an external pad in this design. As an added feature in certain applications, the number of bits in the counter 812 can be selectively trimmed down at the cost of reduced precision. This can be achieved, for example, by bypassing one or more least significant bits (LSBs) in the counter 812 or by supplying a count value directly from a register, such as an input register 814. Input register 814 is operative to receive a data input signal, DIN<0:N-1>, and to generate an output count value, HVAL<0:N-1>, which may be indicative of a count value to be loaded. The data input signal DIN<0:N-1> may be supplied, for example, by external pads or by internal control logic circuitry (not explicitly shown).

A multiplexer (MUX) 816 included in the programmable load circuit 810 is preferably operative to receive either the count value MVAL<0:N-1> generated by counter 812 or the pre-loaded count value HVAL<0:N-1> stored in register 814, and to supply a selected one of these count values, VAL<0:N-1>, concurrently to a second register 818, which may be an output register, and to decoding logic 820 as a function of one or more control signals (not explicitly shown) which may be supplied externally (e.g., from external pads) or internally (e.g., by on-chip control logic circuitry). Register 818 is operative to store the count value of counter 812 indicative of a time at which comparator 806 changes state, as a function of signal SA_OUT generated as an output of the comparator 806. As previously described, the output signal SA_OUT will detect a change in state once a level of the reference signal VREF crosses a level of the sensed MLC parameter VCELL.

In terms of operation, at each transition of the clock CLK (e.g., rising edge and/or falling edge), decoding logic 820 preferably loads the counter output MVAL<0:N-1> and translates this output into a series of selection signals SEL<0:$2^N$-1>, which in turn modifies the reference signal VREF accordingly.

During a read operation, the sense circuit 800 monitors the voltage, VCELL, developing on the sense node N1 and compares this sensed voltage against the reference voltage (VREF). The reference voltage is not a fixed value, as previously described, but varies with time. An amplitude of the reference signal VREF is a function of the sensing time, and the relationship between amplitude and sensing time is recorded by the clock counter. Techniques for generating the reference signal according to embodiments of the invention have been described, for example, in conjunction with FIGS. 7 and 8. In these figures, the reference generation circuitry was depicted as comprising a series of hard-programmed ROM cells, a counter, input/output registers and control logic circuitry. The ROM cells construct a resistor selection network which provides various different resistance levels controlled by the activation of the selection switches in the network (e.g., via control signals SEL<0:$2^N$-1>). It is to be understood, however, that the invention is not limited to the specific reference generation circuitry shown and described herein; rather, one skilled in the art will contemplate other techniques for generating the reference signal given the teachings herein.

Since, in practice, a given memory circuit will typically employ multiple sense circuits for concurrently reading a plurality of memory cells, it is advantageous to share at least a portion of the sense circuit 800 with other sense circuits in the memory circuit. In accordance with aspects of the invention, reference generator 802 may be shared among multiple sense circuits to thereby conserve chip area. Where there are multiple sense circuits sharing portions of the same reference generation circuitry 802, it is preferred that each sense circuit maintains its own storage register(s) for tracking the time at which the reference signal VREF crosses the level of the sensed MLC parameter, since this parameter will likely be different for each individual MLC being sensed. Moreover, as previously stated, a range of the counter 812 (i.e., number of counter bits) is preferably selected to be larger enough so as to accommodate the maximum expected level of the sensed parameter for all of the MLCs being sensed.

Besides MLC sensing, techniques of the invention described herein can also be employed as a build-in-self-test (BIST) unit to read the analog information of a single-bit PCM cell (SLC) with an adjustable reference value. In this scenario, a test configuration pattern can be stored in the input register 814, via data input DIN<0:N−1>. The inventive sensing methodology reduces test time and test cost dramatically compared to conventional approaches.

Figure 9A:
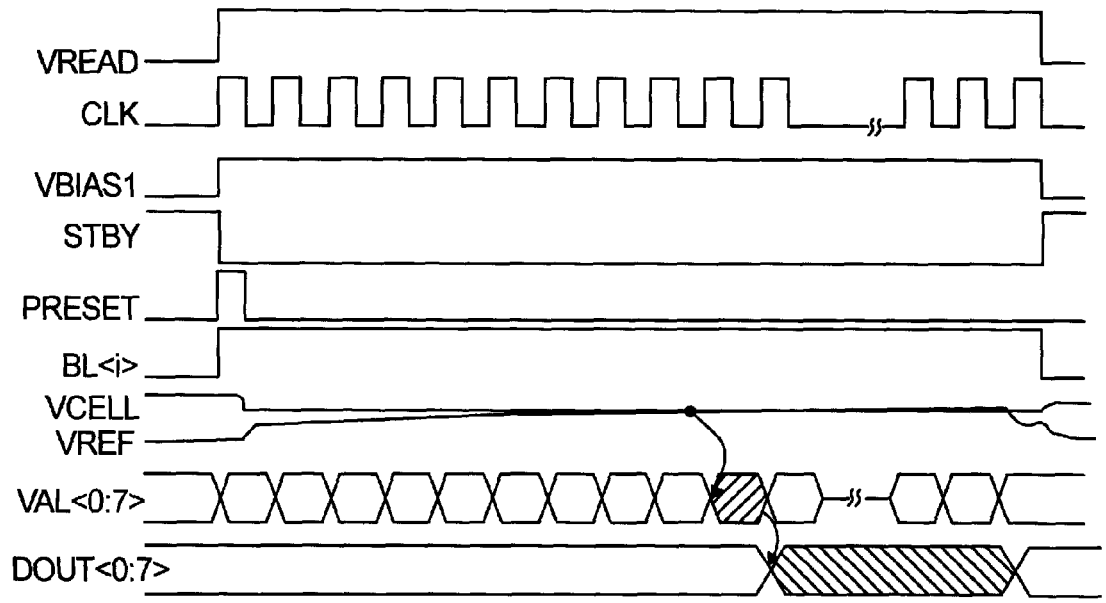
FIGS. 9A and 9B are illustrative waveforms depicting an exemplary operation of the sensing circuit shown in FIG. 8 used in MLC and SLC sensing modes of operation, respectively, according to embodiments of the invention.
Figure 9B:
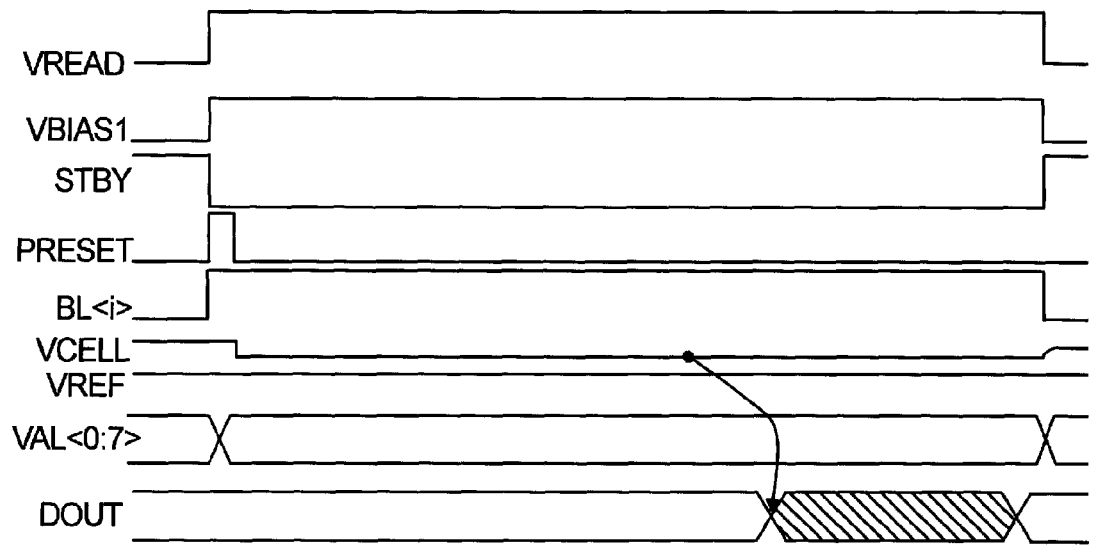

FIGS. 9A and 9B are illustrative waveforms depicting an exemplary operation of the sensing circuit 800 shown in FIG. 8 in MLC and SLC sensing modes of operation, respectively, according to embodiments of the invention. In this example, 8 bits of precision is assumed, although the invention is not limited to any specific sensing precision. With reference to FIGS. 9A and 9B, several of the control signals, such as, for example, VREAD, VBIAS1, STBY, and PRESET, and the sensed parameter developed on a corresponding bit line BL<i>, are the same for both the MLC and SLC sensing modes of operation. In the MLC sensing mode, the signal VAL<0:7> represents the count value generated by the counter (e.g., counter 812 in FIG. 8), which can be seen as changing with every clock cycle. In the SLC sensing mode, the signal VAL<0:7> represents a prescribed pattern loaded into the input register (e.g., input register 814 in FIG. 8), which does not change with the clock. It is also noted in FIG. 9A that the clock CLK does not stop once the comparator changes state. Rather, the change in state of the comparator, which occurs once VREF crosses VCELL, is used to initiate storage of the count value, VAL<0:7> in the output register (e.g., register 818 in FIG. 8), which is then supplied as data output signal DOUT.

The speed of the clock is generally limited only by timing characteristics of a tester and probe (e.g., operating up to about 2-3 MHz). The clock may be triggered on both rising and falling edges, and is thereby equivalent to a clock with twice the frequency of the input clock (e.g., about 4-6 MHz). Ideally, a high-speed clock can be implemented on-chip with a programmable ring oscillator, or an alternative timing circuit, since the sense circuit design does not require high accuracy in the clock signal.

Figure 10:
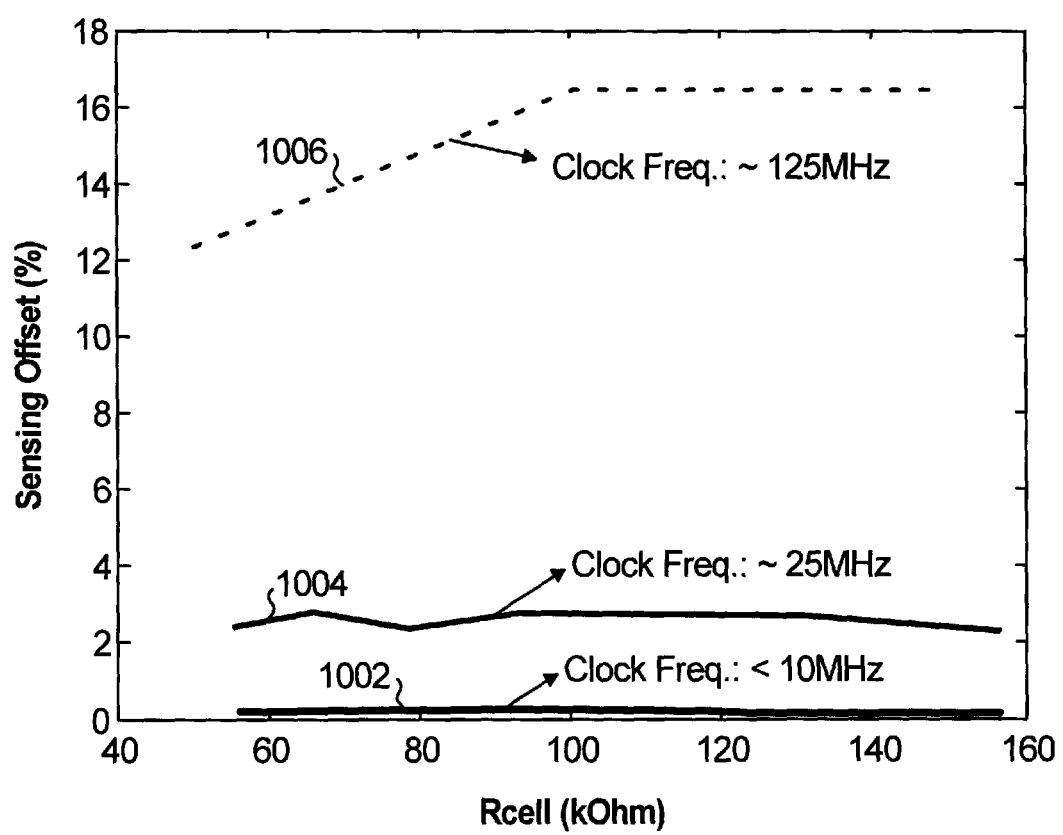
FIG. 10 is a graphical illustration depicting exemplary sensing offset comparisons for different clock frequencies used in the sense circuit shown in FIG. 8, according to an aspect of the invention.

By way of example only and without loss of generality, an exemplary sensing scheme according to an embodiment of the invention was tested under various clock frequencies. With reference now to FIG. 10, experimental measurement shows that when operating at a slower clock frequency (e.g., less than about 10 MHz), a delay between the trigger point (i.e., the cross point of VREF and VCELL) and a change in state of the output signal SA_OUT of the comparator is within one clock period, and hence no offset is observed. This is depicted by waveform 1002. Increasing the clock frequency generally leads to a corresponding increase in offset, as evidenced by waveform 1004 corresponding to a clock frequency of about 25 MHz, which exhibits about 2.5% offset, and waveform 1006 corresponding to a clock frequency of about 125 MHz, which exhibits between about 12.5% and 16.5% offset. Since the sensed resistance levels in the illustrative scenario have a substantially fixed and predictable offset for a fixed clock speed, output data can be accurately calibrated without degrading sense margin.

Additionally, as a beneficially feature, aspects of the invention provide reconfigurability in the sensing scheme. Specifically, the number of bits in the counter can be adjusted as a means of controlling the precision of the sensing operation. For example, the number of bits in the counter can be trimmed down at the cost of reduced sensing precision. This can be achieved, in one embodiment, by bypassing one or more LSBs in the counter or by loading the counter directly from the input register, as previously explained.

There also exists a trade-off between sensing precision and read performance: performance degrades exponentially with an increase in sensing precision. Hence, sensing precision should be chosen in accordance with the number of bits per cell without sacrificing too much performance for MLC operation. For example, for reading an MLC having two bits of information per cell, a minimum of about three bits of precision is adequate (for providing eight reference levels). However, higher precision (e.g., up to eight bits) is available for characterization of SLC cells during a test-mode of operation.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for sensing at least one parameter indicative of a logical state of a multi-level memory cell, the method comprising the steps of:
   measuring the at least one parameter of the multi-level memory cell;
   comparing the measured at least one parameter of the multi-level memory cell with a prescribed reference signal, the reference signal having a value which varies as a function of time; and
   storing a time value corresponding to a point in time at which the reference signal is substantially equal to the measured at least one parameter of the multi-level memory cell, the stored time value being indicative of a sensed logical state of the multi-level memory cell.

2. The method of claim 1, further comprising the steps of:
   storing a start time indicative of a start of a sensing operation of the multi-level memory cell; and
   storing a stop time indicative of the reference signal being substantially equal to the measured at least one parameter of the multi-level memory cell, wherein the stored time value corresponding to the sensing operation is computed as a function of a difference between the start time and the stop time.

3. The method of claim 2, wherein the step of storing the start time is performed by recording a first value of a clock cycle counter at the start of the sensing operation and the step of storing the stop time is performed by recording a second value of the counter when the reference signal is substantially equal to the measured at least one parameter of the multi-level memory cell.

4. The method of claim 3, further comprising modifying a resolution of the sensing operation by varying a number of clock cycles supplied to the clock cycle counter during the sensing operation.

5. The method of claim 2, wherein the time value comprises an elapsed time measured from a start of the sensing operation to when the reference signal is substantially equal to the measured at least one parameter of the multi-level memory cell.

6. The method of claim 1, further comprising modifying a resolution of the sensed at least one parameter by varying a rate of change of the reference signal relative to time.

7. The method of claim 6, wherein the reference signal is generated as a monotonically increasing ramp function.

8. The method of claim 6, wherein the reference signal is generated as a monotonically increasing step function.

9. A sense circuit for sensing at least one parameter indicative of a state of a multi-level memory cell, the sense circuit comprising:
   a reference generator operative to generate a reference signal having a value which dynamically varies as a function of time;
   a monitor circuit operative to measure the at least one parameter of the multi-level memory cell and to generate a sensed parameter signal indicative of a state of the multi-level memory cell;
   a comparator operative to receive the reference signal and the sensed parameter signal and to generate an output signal as a function of a difference between the reference signal and the sensed parameter signal; and
   memory operative as a function of the output signal generated by the comparator to store a time value corresponding to a point in time at which the reference signal is substantially equal to the sensed parameter signal, the stored time value being indicative of a sensed logical state of the multi-level memory cell.

10. The sense circuit of claim 9, further comprising at least one storage register operative to store a start time, indicative of a start of a sensing operation of the multi-level memory cell, and a stop time, indicative of the reference signal being substantially equal to the measured at least one parameter of the multi-level memory cell, wherein the stored time value corresponding to the sensing operation is computed as a function of a difference between the start time and the stop time.

11. The sense circuit of claim 10, further comprising at least one counter adapted to receive a clock signal and operative to generate a count value indicative of a number of clock pulses in the clock signal, wherein a first value of the counter indicative of a start time is stored in the at least one register at the start of the sensing operation, and a second value of the counter indicative of a stop time is stored in the at least one register when the reference signal is substantially equal to the measured at least one parameter of the multi-level memory cell.

12. The circuit of claim 11, wherein a resolution of the sense circuit is controlled at least in part by varying a number of clock cycles supplied to the at least one counter during the sensing operation.

13. The sense circuit of claim 9, wherein the reference generator comprises:
   a current source operative to generate a bias current; and
   a programmable load circuit connected with the current source at a first node, the programmable load circuit being operative to provide an impedance to the current source which varies as a function of at least a first control signal, the reference signal generated by the reference generator having a value which is controllable as a function of the first control signal.

14. The sense circuit of claim 13, wherein the programmable load circuit comprises:
   a plurality of switch elements, each switch element being adapted to receive a corresponding control signal supplied thereto; and
   a plurality of resistive elements, each resistive element being connected in series with a corresponding one of the switch elements, wherein the impedance of the programmable load circuit is controllable as a function of the respective control signals supplied to the plurality of switch elements to thereby form a resistor selection network.

15. The sense circuit of claim 14, wherein each of the plurality of resistive elements has a resistance associated therewith that is within a prescribed range of resistance of a multi-level memory cell being sensed.

16. The sense circuit of claim 14, wherein each of at least a subset of the plurality of switch elements comprises a metal-insulator-semiconductor field effect transistor.

17. The sense circuit of claim 13, wherein the programmable load circuit comprises:
   a counter adapted to receive a clock signal and operative to generate a count value indicative of a duration of a sensing operation of the multi-level memory cell; and
   control logic coupled with the counter, the control logic being operative to generate the at least first control signal as a function of the count value.

18. The sense circuit of claim 17, further comprising at least one storage register, wherein a first value of the counter indicative of a start time is stored in the storage register at the start of the sensing operation, and a second value of the counter indicative of a stop time is stored in the storage register when the reference signal is substantially equal to the measured at least one parameter of the multi-level memory cell.

19. The sense circuit of claim 13, wherein the reference generator comprises:
   a first storage register operative to receive a data input signal and to generate a first count value;
   a counter adapted to receive a clock signal and operative to generate a second count value indicative of a duration of a sensing operation of the multi-level memory cell;
   a multiplexer connected with the first storage register and the counter, the multiplexer being operative to receive either the first count value or the second count value and to supply a selected one of the first and second count values to a second register as a function of at least one control signal.

20. A memory circuit, comprising:
   a memory array including a plurality of multi-level memory cells and at least one word line and a plurality of bit lines coupled with the memory cells for selectively accessing the cells; and
   at least one sense circuit connected with a corresponding one of the bit lines and being operative to sense at least one parameter indicative of a state of a multi-level memory cell, the at least one sense circuit comprising:
      a reference signal generator operative to generate a reference signal having a value which dynamically varies as a function of time;
      a monitor circuit operative to measure the at least one parameter of the multi-level memory cell and to generate a sensed parameter signal indicative of a state of the multi-level memory cell;
      a comparator operative to receive the reference signal and the sensed parameter signal and to generate an output signal as a function of a difference between the reference signal and the sensed parameter signal; and
      a storage element operative, as a function of the output signal generated by the comparator, to store a time value corresponding to a point in time at which the reference signal is substantially equal to the sensed parameter signal, the stored time value being indicative of a sensed logical state of the multi-level memory cell.

* * * * *